United States Patent [19]

Maney et al.

[11] Patent Number: 5,243,665
[45] Date of Patent: Sep. 7, 1993

[54] COMPONENT SURFACE DISTORTION EVALUATION APPARATUS AND METHOD

[75] Inventors: George A. Maney; Elizabeth A. Downing, both of Sunnyvale; Christian Fortunel, San Mateo; Donald J. Christian, Fremont; Melvin H. Lill, San Jose, all of Calif.

[73] Assignee: FMC Corporation, Chicago, Ill.

[21] Appl. No.: 826,197

[22] Filed: Jan. 22, 1992

Related U.S. Application Data

[63] Continuation of Ser. No. 489,643, Mar. 7, 1990, abandoned.

[51] Int. Cl.$^5$ .............................................. G06K 9/00
[52] U.S. Cl. ........................................ 382/8; 358/101; 358/107; 356/376
[58] Field of Search ................. 382/8; 358/101, 106, 358/107; 356/237, 376, 377; 395/119, 120

[56] References Cited

U.S. PATENT DOCUMENTS

| | | | |
|---|---|---|---|
| 3,879,133 | 4/1975 | Mathieu | 356/168 |
| 4,089,608 | 5/1978 | Hoadley | 356/156 |
| 4,525,858 | 6/1985 | Cline et al. | 382/1 |
| 4,555,798 | 11/1985 | Broadbent et al. | 382/8 |
| 4,650,333 | 3/1987 | Crabb et al. | 356/376 |
| 4,652,732 | 3/1987 | Nickl | 235/462 |
| 4,757,550 | 7/1988 | Uga | 382/8 |
| 4,767,212 | 8/1988 | Kitahashi et al. | 356/379 |
| 4,792,232 | 12/1988 | Jobe et al. | 356/394 |
| 4,794,262 | 12/1988 | Sato et al. | 250/560 |
| 4,817,184 | 3/1989 | Thomason et al. | 382/8 |
| 4,893,346 | 1/1990 | Bishop | 382/8 |
| 4,953,100 | 8/1990 | Yotsuya | 364/559 |
| 5,076,697 | 12/1991 | Takagi et al. | 356/376 |

OTHER PUBLICATIONS

Paul, *Robot Manipulators: Mathematics, Programming and Control*, MIT Press, 1981, pp. 9 and 65.
Press et al., *Numerical Recipes in C: The Art of Scientific Computing*, Cambridge Press, 1988, pp. 344–352.
Mardia et al., *Multivariate Analysis*, Academic Press, 1979, pp. 170–175.
One page brochure, Foxboro/Octek Inc. Non Contact Online Measurement, as seen in "Sensors, The Journal of Machine Perception" vol. 4, No. 11, Nov. 1987.
"Fourier Transform Profilometry for the Automatic Measurement of 3-D Object Shapes", M. Takeda et al, Applied Optics, Dec. 15, 1983, vol. 22, No. 24, p. 3977.
"Fourier Transform Method of Fringe Pattern Analysis For Computer Based Topography and Interferometry", M. Takeda et al, Journal of the Optical Society of America, vol. 72, No. 1, Jan. 1982, p. 156.

*Primary Examiner*—David K. Moore
*Assistant Examiner*—Andrew W. Johns
*Attorney, Agent, or Firm*—H. M. Stanley; R. C. Kamp; R. B. Megley

[57] ABSTRACT

A system is disclosed which operates to collect high resolution three-dimensional surface mesh data from mechanical components which are used for component evaluation. The system includes a multidimensionally movable fixture mount for holding the mechanical components. A structured light pattern emitting projector is provided together with an image sensing camera for detecting impingement of the light pattern on the mechanical component and for generating the surface data. A set of software tools analyzes the data to provide numerical or quantitative component analysis and further presents the data in display form to allow intuitive or qualitative analysis for product and process improvement.

38 Claims, 5 Drawing Sheets

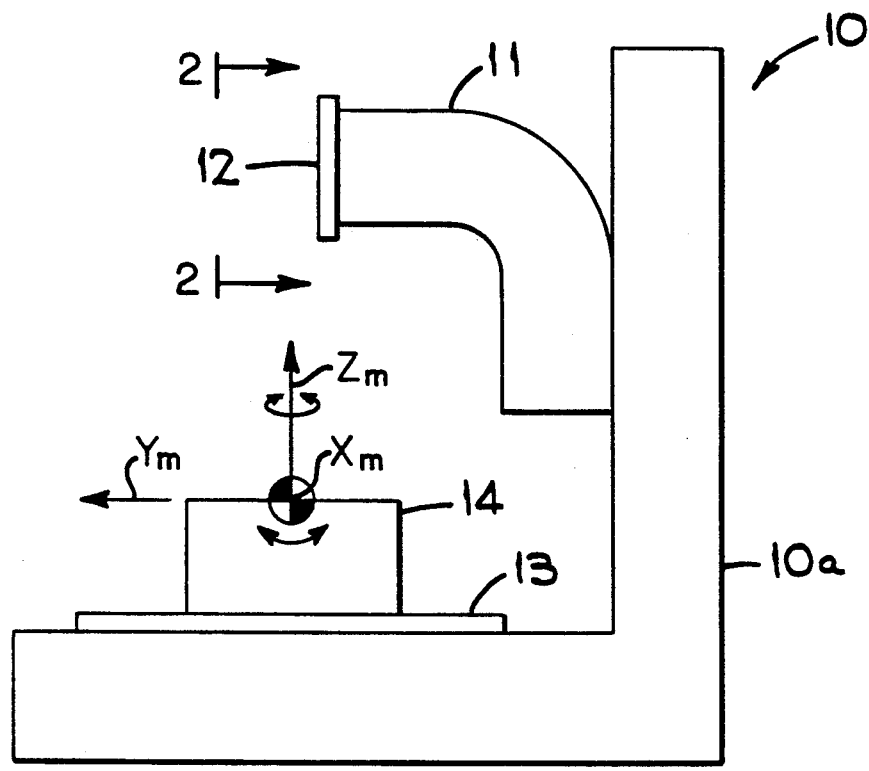
FIG_1
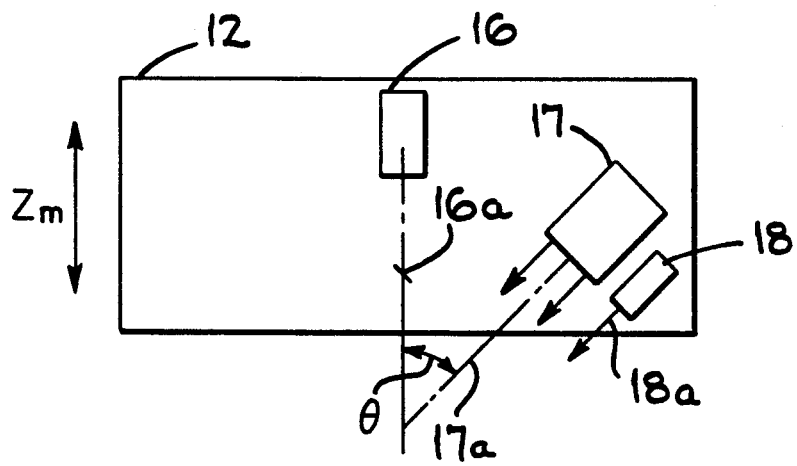
FIG_2

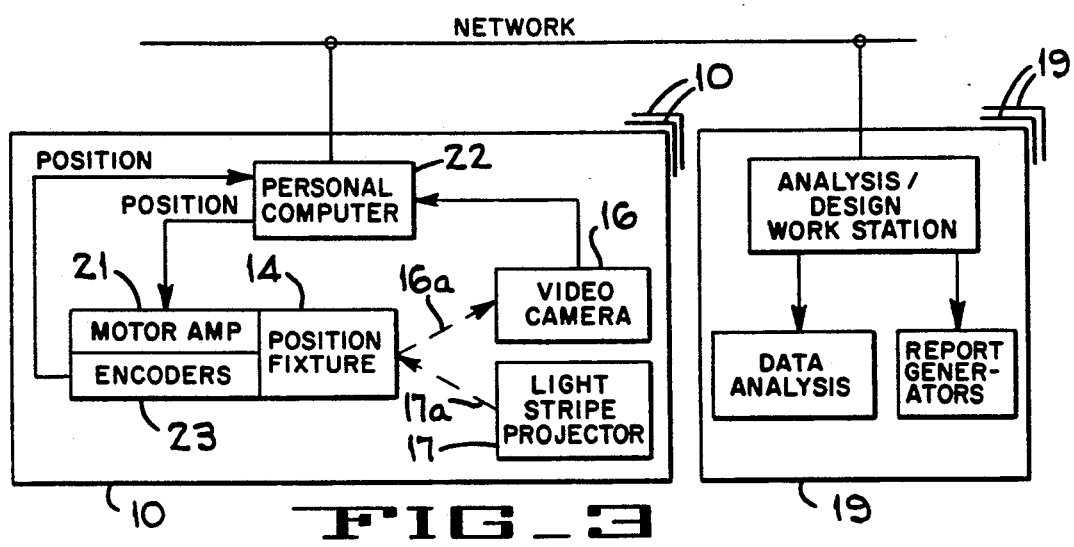
FIG_3
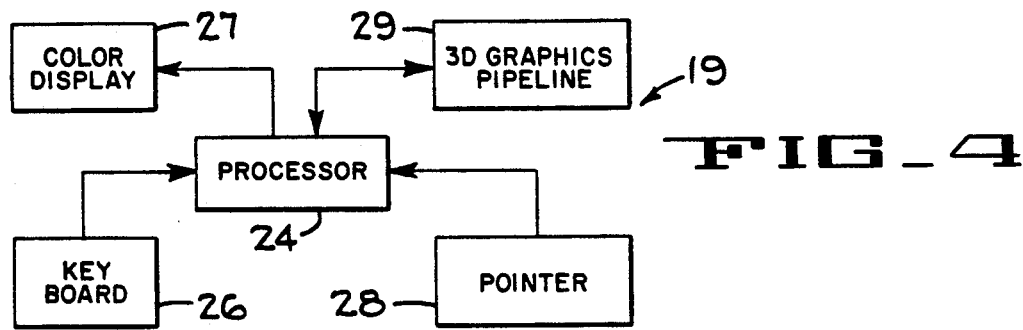
FIG_4
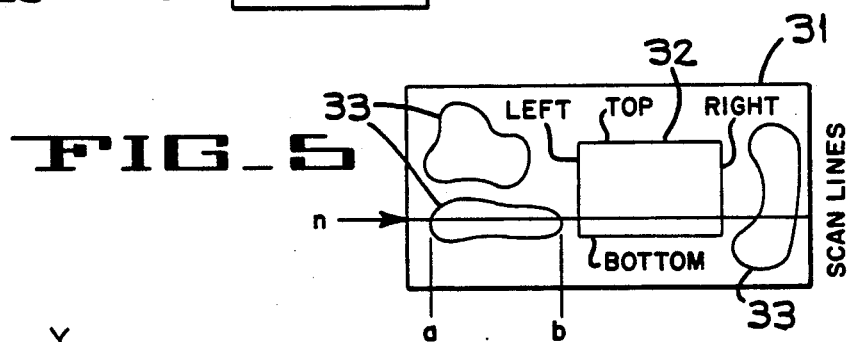
FIG_5
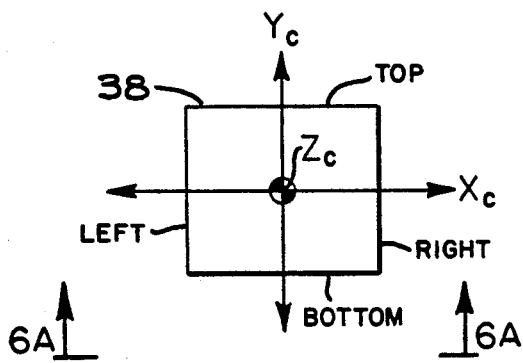
FIG_6
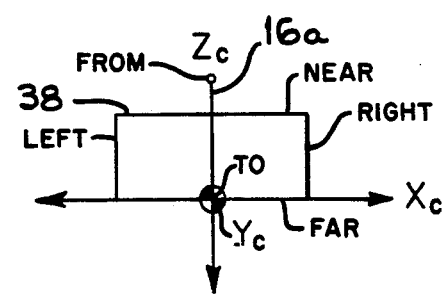
FIG_6A

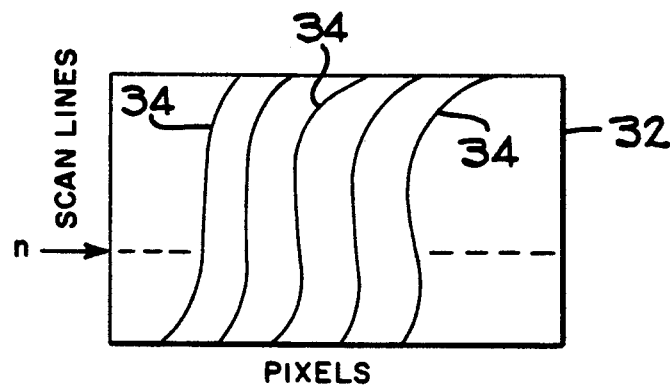
FIG_7
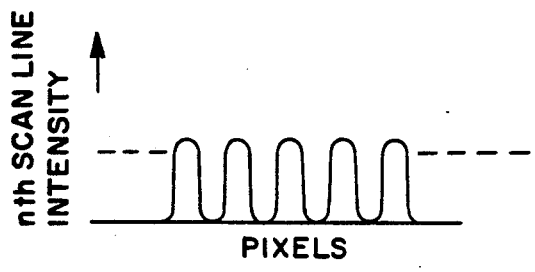
FIG_8
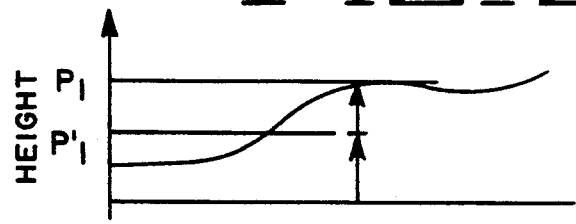
FIG_9
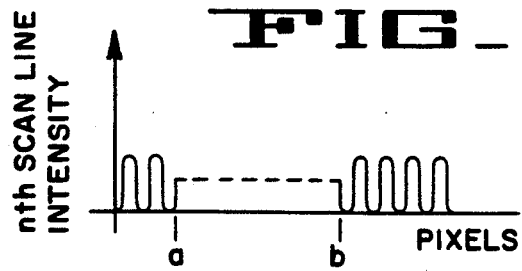
FIG_5A

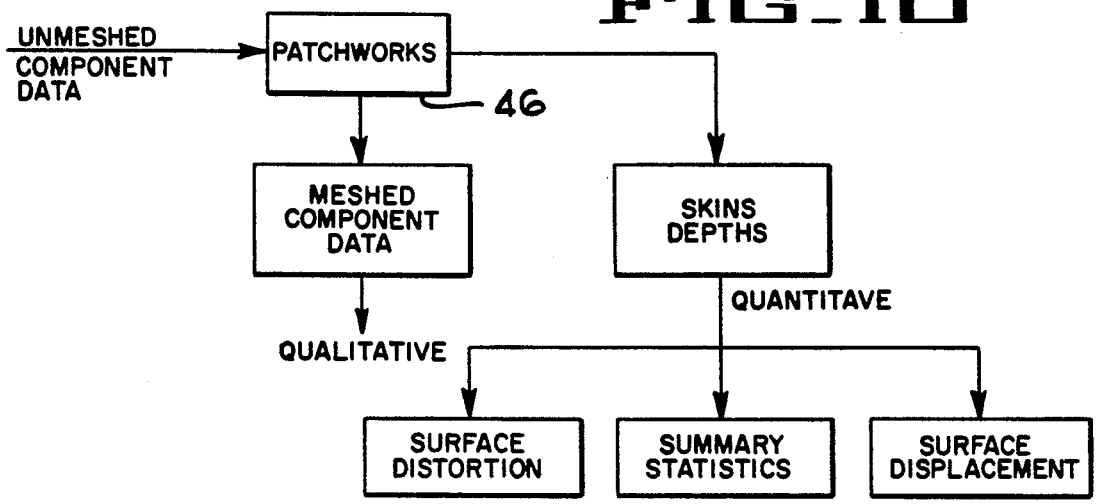
FIG_10
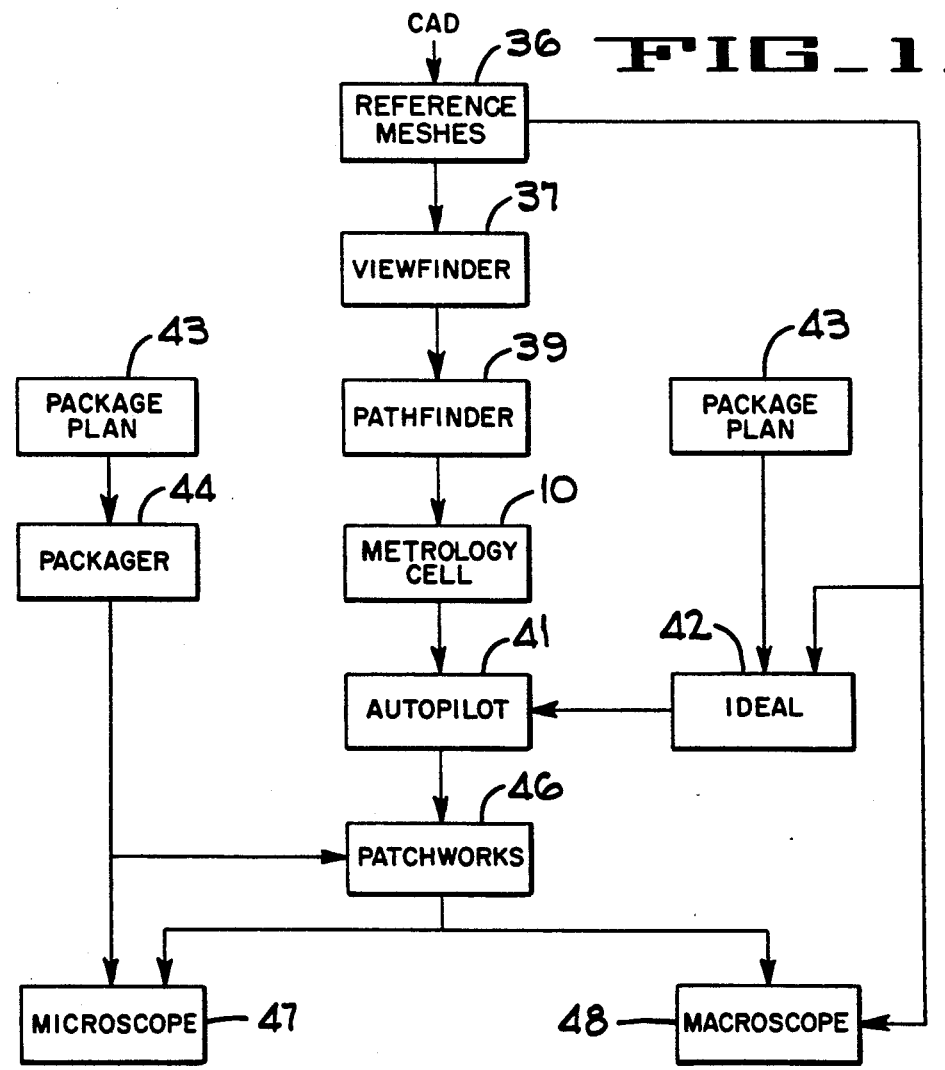
FIG_11

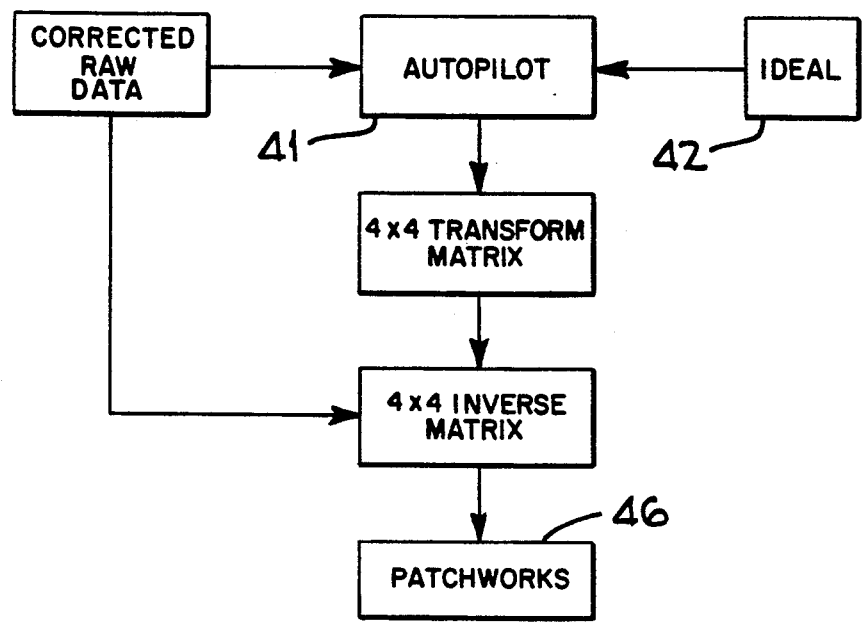
FIG_12
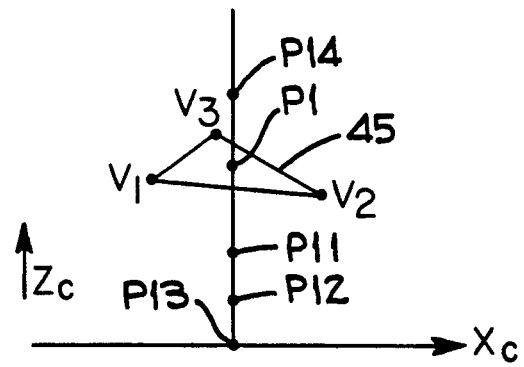
FIG_13
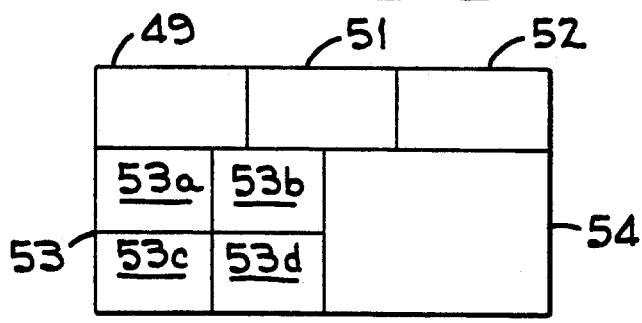
FIG_14

COMPONENT SURFACE DISTORTION EVALUATION APPARATUS AND METHOD

This application is a continuation of application Ser. No. 07/489,643, filed Mar. 7, 1990, abandoned.

SUMMARY OF THE INVENTION

Disclosed herein is a generic mechanical component evaluation system which assumes that all evaluated component surfaces may have local arbitrary distortions or irregularities. The system includes a high band width three dimensional graphics work station having a display, a processor and manual data entry means. The processor is connected to receive component surface design data. A metrology cell coupled to the workstation has a multi axis movable positioner means for holding and positioning the component. A structured light probe is mounted on the positioning means for directing a structured light pattern toward the component. Means is provided for reconstructing discontinuities in the structured light pattern within each view of impingement of the pattern on the component surface. Image acquisition means is mounted on the positioner means also for viewing impingement of the structured light pattern on the component surface and for obtaining three dimensional surface position data relating thereto wherein all three dimensions are variable throughout one view. Fourier transform profilometry means is included for receiving the surface position data and for identifying points on the surface within one view in three dimensions determining the relative positions of the component surface and a surface represented by the component surface design data.

A mechanical component surface mapping system which receives design data for the mechanical component includes a multi-axis positioner means, a mechanical component holding means mounted on the positioner means, a structured light probe mounted on the positioner means directing a structured light pattern toward the holding means, and image acquisition means mounted on the positioner means for viewing a field of impingement of the light pattern on a mechanical component and for providing variable three dimensional data relating to the component surface map. Means is provided for reconstructing discontinuities in the light pattern caused by component surface discontinuities. Computer means is coupled to the multi axis positioner and the image acquisition means for employing Fourier transform profilometry to identify surface points within the field of impingement in three dimensions and for comparing the surface points with the three dimensional design data to determine the position of the component surface relative thereto.

A generic component evaluation system for components subject to fabrication process induced distortions wherein the system is connected to receive CAD data descriptive of the evaluated component and separable into CAD model mesh elements is disclosed herein including planning means having view selection, package plan and packager structure which select an album of views, portions of a CAD model to be viewed and frame of reference conversions respectively. Surface mapping means is connected to the evaluation planning means for providing component three dimensional surface measurement data variable in all three dimensions. Evaluation data reduction means is provided for receiving and reducing the surface measurement data, from a plurality of components and surface measurement data analysis means is provided for receiving the reduced data and for providing analytical data indicative of product and process improvement.

A generic method of mapping a surface on a mechanical part wherein the surface is subject to arbitrary location within design data described limits includes the steps of planning a series of views of portions of the part surface using the design data and processing the design data to identify sets of selected design model surface mesh elements corresponding to each view as well as the limits of each element in two dimensions. Further the process includes the steps of orienting the mechanical part in a known position, projecting a structured light pattern toward the part surface in each view to obtain variable three dimensional part surface measurement data for a plurality of surface points in each view. The steps of acquiring an image of the impinging light pattern in each view, reconstructing discontinuities in the light pattern processing the acquired images using Fourier transform profilometry techniques are included. Correction of three dimensional port surface measurements to best fit the design model together with processing the corrected part surface measurement data comparatively with the design model surface mesh elements to identify correspondence between the plurality of surface points and the design model mesh elements. The method includes the step of calculating the distance between each measured surface point and the corresponding design model mesh element, whereby part skin depth is determined relative to the selected design model.

BRIEF DESCRIPTION OF THE DRAWINGS

FIG. 1 is an elevational view of the metrology cell used in the present invention.

FIG. 2 is a view along the line 2—2 of FIG. 1.

FIG. 3 is a block diagram showing the metrology cell and the workstation of the present invention in a network.

FIG. 4 is a block diagram of one workstation embodiment.

FIG. 5 is a plan view showing the field of the camera sensor in the present invention including a view from which data subject to processing is obtained.

FIG. 5A is a diagram of light sensing within the camera or sensor field across an unuseable data area prior to reconstruction of the structured light pattern.

FIG. 6 shows one side of the binding box which produces the view of FIG. 5.

FIG. 6A is a view along the lines 6A—6A of FIG. 6.

FIG. 7 is a depiction of a view utilized in the present invention.

FIG. 8 is a diagram of light intensity received at the nth scan line in the view of FIG. 7.

FIG. 9 is a depiction of the processed raw data showing measured skin depth of a component part.

FIG. 10 is a block diagram of the data reduction portion of the present invention to obtain qualitative and quantitative outputs.

FIG. 11 is a block diagram of the system of the present invention.

FIG. 12 is a block diagram of one portion of the system of FIG. 11.

FIG. 13 is a two-dimensional diagram showing a measured point in relationship to several CAD model points for a particular model mesh element.

FIG. 14 is a diagram of a display screen used in the present invention.

DESCRIPTION OF THE PREFERRED EMBODIMENT

With reference to FIG. 1 of the drawings the metrology cell 10 of the present invention is shown which is used to evaluate mechanical components. A base or support member 10a has attached thereto a vertically movable arm 11 with an end plate 12 attached thereto. A horizontally extending portion of the base 10a has mounted thereupon a table 13 supporting a fixture 14. The table is capable of moving the fixture linearly in the Y and X directions as indicated in FIG. 1 and the fixture provides rotating motion about the Z axis and the X axis as also indicated in FIG. 1.

FIG. 2 shows the end plate 12 having mounted thereon a line scan or raster scan camera or some similar type of light sensor 16 disposed with its central sensing axis 16a in substantially a vertical direction. A projector 17 of a structured light pattern is also mounted on the end plate 12 in a position to direct the projected light pattern in the direction of a central projection axis 17a. The directions of the central sensor axis and the central projection axis are seen to converge in FIG. 2 at an angle theta (θ). The structured light pattern projected from the projector 17 is, in this embodiment, in the form of a series of parallel light stripes or "zebra" stripes. Mounted adjacent to the projector on the end plate 12 is a horizontal line projector 18 projecting therefrom a light sector and a dark sector with a sharp line of demarcation, the horizon line 18a, therebetween. The horizon line is projected in a direction which converges with the projection axis 17a in the middle of the depth of field of the camera 16. It may be seen by reference to both FIGS. 1 and 2 that the end plate 12 is movable along the Z axis of FIG. 1 by virtue of the vertical movement of the movable arm 11 on the base 10a. Therefore, the sensor 16 and the structured light probe 17 of FIG. 2 are movable together relative to the fixture 14 both linearly in the X, Y and Z axes of FIG. 1 as well as rotationally about the Z and X axes. Thus, a component part mounted on the fixture of 14 is movable about a multiplicity of axes relative to the projector 17 and the camera or sensor 16.

The component evaluation system containing the metrology cell of FIG. 1 is shown in block diagram form in FIG. 3. A local area network has coupled thereto a metrology cell, represented by item number 10, and a workstation shown at 19. The metrology cell and the workstation are both included in the disclosed invention. A number of such metrology cell and workstation combinations may be coupled to the same local area network as indicated in the Figure.

The metrology cell 10 of FIG. 3 can be seen to include the camera 16 and the structured light projector 17 together with the position fixture 14 as hereinbefore described. The position fixture is controlled in position by a number of driving motors (not shown) energized by motor amplifiers 21 which are controlled by a personal computer 22 contained within the metrology cell. The position of the position fixture about the axes described during the explanation of FIG. 1 are monitored by encoders 23. The encoder information is transmitted to the computer 22.

The workstation 19 which functions in concert with the metrology cell 10 collects data generated by the metrology cell for the purpose of analyzing the data and providing data reports. As shown in FIG. 4, the workstation includes a central processor 24, a keyboard 26 for providing system operator input, a color display 27 and a pointer 28 for convenient use of the displays which will be hereinafter described. The workstation 19 has a high graphics band-width three dimensional color graphics engine therein and in the embodiment best known to the inventors includes a three dimensional graphics pipeline 29 which operates to break an algorithm into sequential stages so that the stages may be operated on by different processors for each sequential stage to provide high speed three dimensional graphic renderings. The system structurally disclosed herein including the metrology cell 10 and the workstation 19 treats component part surfaces as being arbitrarily positioned and is not limited to use of a specific set of dimensioning rules such as Geometric Dimensioning and Tolerancing (GD & T) rules. The system allows the measurement of complex surfaces provided by CAD models or ideally formed reference parts which are defined within acceptable surface location limits and which are not describable, for example, by GD & T rules. The data analysis and report generating functions of workstation 19 provide dimensional data which is useful for product and/or process improvement or for experimentation in product or process manufacture and use to determine the effects of such product or process changes as may be investigated. For example, questions relating to raising the annealing temperature in a cast part process or changing a design parameter of a part may be investigated prior to actual process or design parameter change. A visualization tool is provided by the system which allows collected data to be displayed three dimensionally on the color display 27 so that system operator intuitive use of the data collected by the system may be implemented. The system is particularly useful for product and process control relating to heat formed parts such as metal castings and forgings as well as injection molded and other types of cast plastic parts and the like. Thus, the system provides for the collection and analysis of accurate high resolution component surface mapping data sets for use with a set of software tools and techniques, to be hereinafter described, for product and process control and improvement as well as functional ("good" or "bad" part) and parametric (degree of "goodness" of the part) testing.

By way of illustration of the foregoing, the component evaluation system disclosed herein supports the process whereby a single set of high resolution surface maps may be collected as one of the final steps of component production and thereafter used for a variety of purposes related to product and process improvement. Components are typically probed immediately at the end of the production process wherein the probing by the metrology cell 10 produces a set of high resolution surface maps. All or part of the component surface may be mapped. Probing resolution and accuracy limits may be varied as necessary by the operator of the system over the surface of the component part. The surface of each component part is compared against a set of minimum and maximum limit envelopes obtained from CAD data for the component. Alternatively, the component part surface measurement data is compared to data obtained from measurement of an ideally constructed reference part and limit envelopes entered into the system in conjunction with the reference part measurements. Those components which conform to these limits are acceptable. Those components which do not conform may be subjected to further analysis for various purposes. The components which are forwarded by shipment are uniquely identified by some means which may be machine readable, i.e., bar coded. Component data is also retained at the component production site for use in product control and process control as hereinbefore recited. Prior to use of the component parts the surface map data collected at the production site is retrieved based on the unique component part identifiers so that the data can then be used for adapting the assembly process set up and execution to maximize some further assembly or process objective.

FIG. 5 shows the field of view 31 of the camera or sensor 16. The field of view encompasses a portion of the surface of a component part to be evaluated. Within the field of view of the camera is a subportion thereof called a view 32. Also included in the camera field are unuseable areas 33 for the purposes of this invention. Three such unuseable areas are shown in FIG. 5, wherein shadowing or discontinuities on the component surface are seen in the parallel light stripe pattern referred to hereinbefore when it falls upon the part surface.

The camera field 31 is made up in this embodiment of 512 horizontal scan lines and 512 individual pixels or sensors in each horizontal scan line. The view 32 may be seen in FIG. 7 wherein a portion of the structured light pattern represented by lines 34 impinges on the surface of a component part, the lines assuming the shapes shown due to curvature of the part surface. The stripe pattern image as seen in FIG. 7 is processed to obtain the three dimensional coordinate positions of points on the surface of a component part in the camera or sensor 17 frame of reference. The manner in which this is accomplished is explained in the technical papers "Fourier Transform Profilometry For The Automatic Measurement Of Three-D Object Shapes", Mitsuo Takeda et al, Applied Optics, Volume 22, No. 24, 15 Dec. 1983, page 3977, and "Fourier Transform Method Of Fringe Pattern Analysis For Computer Based Topography And Interferometry", Mitsuo Takeda et al, Journal of the Optical Society of America, Volume 72, No. 1, January, 1982, pages 156-160 ."

The stripe pattern image processing undertaken as explained in the two Takeda et al papers introduces a $2\pi$ ambiguity in the measurement in space of a group of points. The stripe spacing of the pattern of FIG. 7 is $2\pi$. The horizon line projector 18 seen in FIG. 2 is utilized as a range finder to resolve the $2\pi$ ambiguity, whereby the measured points in three dimensional coordinates are located in the camera frame of reference. For purposes of this discussion the metrology cell frame of reference is designated $X_m$, $Y_m$, and $Z_m$, while the camera frame of reference is $X_c$, $Y_c$, and $Z_c$. With the angle theta ($\theta$) known between the centerlines of projection and reception (17a and 16a respectively) of the structured light pattern projector 17 and the camera or sensor 16 as seen in FIG. 2, the manner of transposing between the camera frame of reference and the metrology cell frame of reference of the three dimensional points as sensed by the camera is known to those of ordinary skill in this art. As a result, the three dimensional coordinate locations of the measured points are ultimately obtained in the metrology cell coordinate system shown in FIG. 1.

The profilometry method utilized in conjunction with this invention requires that all of the "zebra" stripes in the camera appear to be continuous. Therefore, prior to reduction of the data obtained by the camera, the unuseable areas 33 seen in FIG. 5 are reconstructed to make them appear as continuous surfaces by reconstructing the "zebra" stripes passing therethrough to eliminate those discontinuities in the stripes which occur on the surfaces of complex shaped parts due to shadowing and discontinuities in the surface. With reference to FIGS. 5 and 5A a shadowed or discontinuous area for the zebra stripes 34 is seen extending from a to b across which the nth scan line extends. Note that the shadowing 33 extending from a to b in FIG. 5 is outside the view 32 but nonetheless inside the camera field 31. The entire camera field must be reconstructed through the unuseable areas 33 to show continuous "zebra" stripes for the profilometry to be performed. FIG. 5A shows that the shadowing in the unuseable area 33 between a and b produces no signals from the pixels in the nth scan line in the camera view 31. The function from a to b in FIG. 5A may be filled in or reconstructed by a number of functions, such as $Y = \sin(AX+B)$ where the constants A and B are estimated by regression on a segment of the scan line free of discontinuities.

FIG. 8 of the drawings shows the signal from the pixels along the nth scan line in the view 32 of FIG. 7. The phase and amplitude of the signal produced by impingement of light on the pixels in the scan line contains the surface Z coordinate or surface height information. This information is extracted as explained hereinbefore by means of the profilometry techniques described in the Takeda et al papers to extract a raw surface map data set. As a result, height information for the part surface is obtained for the part position corresponding to the nth scan line in the view as shown in FIG. 9. The measured point P1 indicates a point on the surface of the component which may be compared with a point P'1 representing a point on a surface of one of the CAD models. Various CAD models are compared with the measured part surface data for various purposes which will be hereinafter described.

Turning now to FIG. 11 of the drawings, either the component part CAD data or data obtained through probe measurement of a reference part, as mentioned earlier herein, are used to derive a reference surface mesh as seen at 36. Meshes of this type are often used in finite element analysis and may be generated manually or automatically. Many CAD packages have optional surface mesh generation modules. The mesh elements are in the shape of polygons and are usually, but need not be, identical mesh elements, for example, all triangular. For the purposes of this explanation the mesh elements will be triangular elements. Several reference models may be available. A model of an ideal finished part, an ideal casting configuration for the part, an inner acceptance limit for a cast part or an outer acceptance limit for the casting may all be useful for determining measured surface characteristics of the part. The CAD data or measured reference part data is transformed into the frame of reference of the camera or sensor 16, because that is the way the camera will observe the various views in carrying out the process of the present invention.

Viewfinder, seen at 37 in FIG. 11, is a design tool which is intended for use in defining a set of views to be used in observing a component part. A view specifies location and orientation that the structured light probe 17 must assume to collect three dimensional surface map data for component part evaluation. Viewfinder uses a model of the component part to be evaluated as an aid to the system operator in selecting the position and orientation of the structured light probe for each view. Viewfinder selectively provides several simultaneous model views of the relative position of the component and camera as well as a camera's eye view of the component. In addition to probe position, the parameters of the view include the dimensions of a rectangular prism which will serve as a bounding box for collecting data points. A grid on the far surface ($X_c$, $Y_c$ plane FIGS. 6 and 6A) of this box serves as a specification of the horizontal and vertical frequency of data points to be used in building the mesh. Referring to FIGS. 6 and 6A, a view line (seen as 16a in FIG. 1) consists of a "from" and a "to" point in cartesian coordinates. The bounding box is shown as item 38 in FIGS. 6 and 6A, having a top and a bottom, a left and a right side, and a near and a far plane. The far plane is seen to rest in the $X_c$, $Y_c$ plane within the camera frame of reference and is seen to coincide with the view 32 of FIG. 5. Each view is characterized by fifteen parameters in the camera frame of reference which include the cartesian coordinates of the "from" point and the "to" point as well as the six bounding surfaces of the right rectangular prism (bounding box 38) constituting each view; near, far, left, right, top and bottom. Additionally, a twist parameter which describes the rotation of the bounding box 38 about the view line 16a and the horizontal and vertical distances between the mesh points for mesh resolution characterize each view. The number of views which are constructed to map the surface of a component part are left to the judgment of the system operator. As few views as possible should be used obtaining the maximum surface area of the part. The data density per view is also determined in the discretion of the operator. Further, discontinuities within each view must be avoided. Such factors as shadowing, reflection, and maintaining the surface of the part within the field depth of the camera or sensor lens must be taken into account in the definition of each view. A set of views is called an album. The views contained in an album may cover all or a portion of the surface of the component part. Viewfinder therefore serves as an editor for individual views and for selection of an album of views.

An optional feature of the present invention includes a path planner seen as pathfinder 39 in FIG. 11. Pathfinder is a tool used to sequence the views in an album, wherein the sequencing is time efficient and follows practical or visible paths. The optimal sequence of views from the album is intended to provide minimum motion of the structured light probe 17 and to avoid collisions between any combination of a component part, probe, and the various structural parts of the probe positioner. The sequencing of the probe positions to obtain the views in the album can be done manually or automatically. Automatic sequencing of probe positions to minimize distance traveled is a form of the classic traveling salesman problem which may be solved by means of the method of simulated annealing described in the text "Numerical Recipes in C, The Art of Scientific Computing", Cambridge University Press, Copyright 1988, pages 345-352. Collision detection during probe motion may be implemented by providing a display of the moving probe on the path to see if any collisions occur. The execution of the path plan by the metrology cell while evaluating a component part results in one set of raw surface mesh data points for each view in the plan. The position of each raw data point is corrected in three dimensional space using calibration data for camera lens distortion, mechanical camera mounting error, etc. based on the observed position of the raw data point to yield a true position for each data point.

As described in conjunction with FIG. 3 metrology cell 10 includes the control computer 22 with capability for video image capture, motion control, and image pipeline processing. The structured light projector 17 has a light source and optics which produce a field of parallel stripes or "zebra" stripes 34, wherein the light source may be, but is not necessarily, monochromatic or coherent. The video imager 16 may be any sort of raster scan or line scan video imager. The camera lens should provide images which are relatively close to being without perspective. The structured light probe positioner is constituted by the vertical motion imparted to the arm 11 (FIG. 1) together with the motion provided on the table 13 as discussed in connection with FIG. 1. Motion control software runs the table 13 and the arm 11 and accepts the sequence of views which may be determined by pathfinder 39. As a result, a structured light illuminated surface image is acquired for each designated view 32.

The position of the fixture 14 of FIG. 1 relative to the camera 16 may be driven by any combination of standard electromechanical, hydraulic, or pneumatic mechanisms. As previously mentioned, the position of each axis of the fixture 14 is sensed by encoders or suitable alternatives, each axis having limit switches, a home switch, and calibration means if desirable.

A raster frame grabber connected to the camera sensor 16 obtains a single view 32 providing view signals which may be processed immediately or stored for later processing. The processing is by means of the Fourier profilometry technique described in the aforementioned Takeda et al papers through an array processor, i.e., Western Electric 3200 series array processor, contained in the computer 22 of the metrology cell 10. The single view data is reconstructed, as described in conjunction with FIG. 5, prior to processing. The resulting raw measured data from the component part surface is adjusted with the calibration tables for lens distortion, projector/camera angle $\theta$, camera mounting error, etc. as mentioned hereinbefore. The "zebra" stripe $2\pi$ ambiguity resolution is obtained using the single line or horizon line 18a provided by projector 18, and the adjusted or corrected raw data is provided as the output from metrology cell 10.

The corrected raw data from metrology cell 10 may optionally be directed to a routine called autopilot seen as item 41 in FIG. 11. Autopilot provides information to correct data for orientation of a particular component part in its fixture. A perfect component part model is generated from CAD data by a routine called ideal seen as item 42 in FIG. 11. Alternatively, the perfect part model is provided by measurement of a reference part at the metrology cell 10 as described hereinbefore. The ideal component CAD model or the reference part model is provided to autopilot 41 along with the corrected raw component data. Since only certain views of the component part have been selected by viewfinder 37, the entire ideal CAD model or reference part model is not necessary to the function of autopilot. A package plan 43 is provided to reduce the component part data and CAD or reference part data which must be compared thereto. The package plan is used to determine which zones of which CAD or reference part models will be of interest in each view so that the CAD or reference part surface mesh data may be preprocessed for use with a particular component part. As seen in FIG. 11, the package plan 43 is not only an input to the ideal routine 42, but also to a packager routine 44 which will be discussed in detail hereinafter.

As seen in FIG. 12, the output from the ideal routine 42, the pertinent portions (as determined by package plan 43) of a perfectly or ideally formed component part, are transmitted to autopilot 41. The corrected raw data from the metrology cell 10 is also input to autopilot. The corrected raw data is compared point by point on a sample basis for all views against the corresponding point locations expected from the perfect CAD model component. A 4×4 element homogenous transform matrix is produced from these points by vector regression. This transform matrix is used to reposition and reorient the corrected data through the 4×4 element inverse matrix shown in FIG. 12 so that the data collected from the component part best fits that expected from a perfect component part as represented by the CAD model. The vector regression technique may make use of the ordinary least squares technique which is fast, but which won't deal, for example, with component parts exhibiting certain patterns of global dimensional distortion. The generalized least squares technique will deal with global dimensional distortion, but is significantly slower. The details of the vector regression technique may be seen in the text "Multivariate Analysis", Mardia et al, Academic Press, Copyright 1979, section 6.6, pages 171-175. The output of autopilot 41 is therefore a correction of the data for the orientation of the part in the fixture, or for fixture mounting error. This fixture error corrected raw data is input to a routine seen as patchworks 46 in both FIGS. 11 and 12.

The packager routine 44 seen in FIG. 11 creates a set of data for a specific component part which involves taking all of the surface mesh elements to be considered for each view and transforming the coordinates of each mesh element from the metrology cell or part frame of reference $X_m$, $Y_m$, $Z_m$ into the frame of reference of the view or the camera $X_c$, $Y_c$ and $Z_c$. With reference to FIG. 13 a triangular mesh element 45 having vertices V1, V2 and V3 is shown having a point P1 within the triangular element. Points P11, P12, P13 and P14 are shown all lying on a line which is orthogonal to the $X_c$, $Y_c$ plane and extending thereabove in the $Z_c$ direction.

The vertices V1 and V2 may each be seen to have X coordinates. The mesh elements are arranged by the packager routine in the order of their X component of position. Thereafter, the X minimum and maximum values, the X coordinate values for vertices V1 and V2 respectively in FIG. 13 for example, are obtained for each element. In like fashion the minimum and maximum Y coordinate values for each element are obtained. Packager having converted coordinates of each mesh element to the view or camera frame of reference, having sorted the elements in order of X component of position, and having obtained the minimum and maximum X and Y values for each element, provides this data to patchworks 46.

The efficiency of the process employed to compute skin depth of a casting or other component part formed by similar processes, is a crucial factor affecting the desirability of a component evaluation system. The corrected raw data from the metrology cell 10 or the repositioned raw data output by autopilot 41, whichever is selected, is input to patchworks 46. The input data is checked for points which lie outside of the bounding box 38 seen in FIGS. 6 and 6A. Those points which do not lie within the bounding box of the view 32 may be discarded. The remaining data is termed the filtered data. The first step in computing component part skin thickness from the component part data for a view is to sort the data points in order of the X component position. Each component part data point is then processed in a sort order. Each point is compared to all elements of all zones within a view with minimum and maximums coordinates which encompass or span the X coordinate of the component data point. This process is begun by selecting a first sorted component part data point and comparing it with minimum and maximum X coordinate values of the elements vertices such as V1 and V2 of FIG. 13. If the X coordinates of all mesh element vertices are greater than that of the point then the point is eliminated from all future trials. If the X coordinate of all mesh vertices are smaller than the X coordinate point then that element is also eliminated from all future trials. This process continues until all CAD or reference model mesh elements are exhausted, all component part points are exhausted, or until the point is spanned by the minimum and maximum X coordinates of the vertices of a model element. When a component part data point is spanned by the X coordinates of a CAD or reference model element, a check is made to verify that the point is also spanned by the minimum and maximum Y coordinates of the mesh element. Both conditions must be satisfied. If a component part surface data point is spanned by both X and Y coordinates of a CAD or reference model mesh element then the point is checked to determine whether it falls within the boundaries of the mesh element in X, Y space. This is done in the case of an N-gonal mesh element by considering N triangles defined by the component part data point and each of the sides of the N-gon. In the case of triangular mesh elements, the area of each triangle is computed by forming the coordinates of the vertices of each triangle into the columns of a three-square matrix and calculating the determinant of this matrix. The point is contained within the triangle if, and only if, the signs of the determinant of each of these matrices are the same.

If the component part surface data point is found to be contained within the mesh element, then a skin thickness of that combination of mesh model and data point is computed by interpolation. The component part surface data point is compared against the remaining sorted CAD or reference model mesh elements until the next mesh element fails to span the point in the X coordinate. The next part surface data point in the sort order is then considered. The maximum vertex X coordinate value of each remaining model mesh element is compared against the X coordinate of the part surface data point. Those elements with a maximum value less than the current point are eliminated. All remaining mesh elements are checked until the minimum X coordinate of an element is greater than the X coordinate of the part surface data point. As before, the next part surface data point is selected for consideration in the predetermined sort order. The process is repeated for each part surface data point until all data points are eliminated or all CAD or reference model mesh elements are eliminated. In this fashion, the skin thickness coordinate for the component part surface data point is obtained.

The skin depth or $Z_c$ axis distance between each of the filtered component part points and one or more of the CAD or reference model mesh elements is checked for each point of each view relative to the view frame of reference. The CAD or reference models used for skin depth determination might include inner and outer acceptance limit surfaces for the component part represented for one data point P1 as points P11 and P14 respectively in FIG. 13. Alternatively, the point may represent a point on an ideal component model such as point P12 in FIG. 13. If the component part being tested is not a finished part, then the CAD or reference models may be semifinished or finished parts having a point on the finished part surface such as point P13 in FIG. 13.

Patchworks provides meshed component part data for qualitative analysis by an operator of the system as shown in FIG. 10. As also seen in FIG. 10 the skin depth previously described herein may be reduced to summary statistics by view or by component part. The statistics might include the number of corrected data points, the number of points lying outside the boundary box 38, the number of points for which the skin depth can be determined for each CAD or reference model, as well as a number of other statistics such as variance, skewness, median, etc. relating to each CAD or reference model as seen by the "summary statistics" box shown in FIG. 10. Multivariate regression is used to fit a quadratic surface to the difference between the filtered component part surface data and the ideal CAD or reference model in each view. This process is described in the Mardia text to which reference has been made hereinbefore. The parameters of this quadratic function, the magnitude of the determinant of the matrix, and the regression fit characteristics illustrate component local distortions as shown by "surface distortion" box in FIG. 10. Vector regression is used to fit a square 16 element homogenous transform to the difference between the filtered component part of the surface data and the ideal CAD or reference model in each view. The parameters of this transform function, the magnitude of the determinant of the transform matrix, and the regression fit characterize component surface displacement for each view as shown by the "surface displacement" box in FIG. 10. It may therefore be seen that patchworks 46 provides output which may be used for both qualitative and quantitative analysis of component parts or a series of a component part which are subjected to measurement in the metrology cell 10 of the present invention.

The component evaluation system disclosed herein incorporates user-interface features intended to facilitate examination and visualization of component part surface mesh data. Referring to FIG. 14 an icon box area is provided at the top of the display screen 27 for user information display as well as for selecting and controlling system functions. A data selection and visibility control box 49 is seen at the left, a miscellaneous display and control box 51 is seen in the center and a viewpoint control box 52 is seen at the right across the top of the screen. A multiple pane fixed position windowing system includes left and right square windows 53 and 54 respectively. The left window 53 consists of four sub windows 53a through d which can be displayed in quadrants or singly. Any window or subwindow can be selected as the current window by using the workstation pointing device 28 of FIG. 4. The current window can be displayed on the full workstation screen 27.

An area of the display 27 is provided for showing and controlling the location and orientation of the viewpoint of the current window. The viewpoint of the current window is described by two points in space, "from" and "to" as described hereinbefore, a zoom factor, a twist angle, and the three dimensional bounding box 38 defined by the parameters as shown in FIGS. 6 and 6A. These parameters can be increased or decreased or changed using normal data entry means. Selection may be made which allows the display point of view of the current window to be varied continuously about its nominal position by moving the workstation pointer 28 in two dimensions. An area of the display is provided for choosing and displaying various combinations of CAD or reference model surface meshes, component parts, probe envelopes, and other data to be used by the system. Each of the CAD or reference part surface mesh models and component part surface meshes selected for use may be selected for display. "Near" and "far" adjustable slicing planes are available for allowing interior and cross section views of CAD reference part and component part surface models. Various other facilities are provided for use by the operator to assist in illustrating CAD or reference part models or production component part models to assist the operator in making intuitive or qualitative judgments with respect to product or process improvements which may be indicated by the collected component part data.

Tools are provided by the component evaluation system described herein for examining and visualizing the reduced component surface mesh data as provided by patchworks 46. These tools are represented by Microscope 47 and Macroscope 48 seen in FIG. 11. Microscope supports analysis in the frame of reference of the camera or sensor 16. Macroscope supports analysis in the component part frame of reference. Both tools provide capabilities for both intuitive or qualitative analysis as well as numerical or quantitative analysis.

Microscope 47 provides facilities for analysis of component part surface mesh data collected by a component evaluation system study. The data for each component part is a set of surface views. Each position of the structured light probe 17 produces one view. Microscope is capable of looking at any one view in relation to design information including CAD or reference part data models of a component part in various phases of processing. Such things as surface distortion of a part, surface displacement of a part or part breakthrough relative to a casting CAD or reference model may be visually displayed on the color display 27 of FIG. 4.

The microscope user interface includes two square windows, a left hand window 53 and a right hand window 54 as seen in FIG. 14. The right hand window is a single pane window. The left hand window has four panes 53a–d. Each of these five panes has a separate point of view and depth of field. Each can be used to view the current workpiece as well as up to four CAD design models, and an NC tool path.

The left hand window 53 can display all of its panes simultaneously in separate quadrants or one pane at a time. A set of "radio button" boxes above the left window control which pane or panes are currently displayed.

These radio buttons are marked for each of the four quadrants of the window: NE, NW, SW, and SE. Not more than one of these buttons can be selected at one time. If one of the buttons is selected then the pane from the corresponding quadrant fills the entire window. If none of the buttons is selected then all four quadrants are displayed.

The buttons are controlled by selection with the mouse. Selecting a button which is off will turn that button on and all others off. Selecting a button that is on will turn that button off.

At any given time one of the visible window panes is the current pane. The current pane is identified by a red border; all other panes have a white border. The current pane can be changed by selecting any of the visible panes with the mouse. If any of the left hand window panes are selected then selecting any of the panes to fill the window will make that pane the current pane. When the left hand window changes from a single pane to a quad pane display the last window displayed as a single pane will be the current pane. That pane remains the current pane if the left window reverts to the four quadrant display.

The Microscope control panel consists of database, viewpoint, cursor, option, and distortion meter areas. The database control panel area contains: workpiece box;

Selecting this box with the mouse will cause a listing of the workpiece surface map data sets currently held in the database. Any of these datasets can be loaded by selecting the desired dataset name with the mouse. The selection process can be aborted either by selecting an empty position or by depressing the escape key. The name of the selected dataset is display in the area to the right of the box. An asterisk (*) in this position means that no package is currently loaded.

part, casting, inner, and outer boxes;

These boxes display the name of the CAD design models that were used to generate the current CAD package.

both off/mesh on/panes on/both on boxes;

Each box has one of four values. The mesh on value displays the visible areas of the mesh as an open mesh. Panels on displays the visible areas of the mesh as a filled mesh with backface hiding. Both on displays the visible areas of the mesh with both the open and filled meshes. In this last mode the model appears as a filled mesh from the outside and an open mesh from the inside of the mesh.

Selecting one of the boxes with the mouse alters the visibility of the workpiece or one of the design models. Selection of a box with the right mouse button causes the value of this box to cycle forward. Selection of a box with the left mouse button causes the value of this box to cycle backward.

Five of these boxes are provided, one for each type of CAD design model as well as one for the workpiece mesh. These boxes control whether the visible areas (zones for models, patches for the workpiece) of each of the five mesh types will be displayed and how.

toolpath;

Selecting this box with the mouse will cause a listing of the toolpaths currently held in the database, Any of these toolpaths can be loaded by selecting the desired toolpath name with the mouse. The selection process can be aborted either by selecting an empty position or by depressing the escape key. The name of the selected toolpath is displayed in the area to the right of the box. An asterisk (*) in this position means that no toolpath is currently loaded.

drawing;

Selecting this box with the mouse will cause a listing of CAD drawings currently held in the database. Any of these drawings can be loaded by selecting the desired drawing name with the mouse. The selection process can be aborted either by selecting an empty position or by depressing the escape key. The name of the selected drawing is displayed in the area to the right of the box. An asterisk (*) in this position means that no drawing is currently loaded.

alarm limits;

Selecting this box with the mouse will cause a listing of the sets of the patch summary statistics alarm limits currently held in the database. Any of these limit sets can be loaded by selecting the desired limit set name with the mouse. The selection process can be aborted either by selecting an empty position or by depressing the escape key. The name of the selected limit set is displayed in the area to the right of the box. An asterisk (*) in this position means that the limit set is currently loaded.

current patch;

Selecting the current patch box with the mouse causes a popup patch selector to be displayed. Those patches with colored borders are defined but not visible. Those patches with colored backgrounds are defined and visible. All other patches are undefined. Any patch can be selected.

skins;

This box controls the skin displays. Four skin displays are available; part, casting, inner, and outer. The skin display consists of a grid of lines connecting each point on the workpiece data collection grid with a coincident point on one of the four CAD design models. The line segment is colored green for points with positive skin depth or red for points with negative skin depth. Any of these skin displays can be activated by selecting the corresponding box with the mouse. Only one display can be on at one time. Selecting the box corresponding to a currently active skin display deactivates the display. Selecting any of the skin depth histogram displays deactivates any active skin display.

The viewpoint control panel appears in the upper right hand corner of the screen above the right hand window. Ten viewpoint parameters are provided for controlling the location and orientation of the current pane. The location and orientation in space of the viewpoint is specified primarily by two points; from and to. Both of these points have X, Y, and Z Cartesian coordinates in three space. The "from" point is the position of the origin of the viewpoint. The "to" point is a point in the exact center of the field of view of the viewpoint. The twist parameter controls the rotation of the field of view around the line connecting the from and to points. The zoom parameter is a scaling factor for the field of view parameters. Near and far control the depth of field of the current pane.

Viewpoint parameters are modified by use of the mouse. The right hand mouse button increases the value of each parameter by the rate value shown immediately to the left of each parameter. If the right button is held down the parameter value is incremented continuously at about 2 increments per second after a short delay. The left hand mouse button works in the same way but decrements the parameter.

The center mouse button causes a data entry popup box to appear allowing a new parameter value to be entered from the keyboard. Data entry can be aborted by depressing one of the mouse buttons or the escape key. The rates associated with each parameter can be changed using the mouse in very much the same way as the parameters themselves. The right hand mouse button causes a ten percent rate increase; the left a ten percent decrease. The center mouse button causes a data entry popup box to appear allowing a new rate value to be entered from the keyboard. Data entry can be aborted by depressing one of the mouse buttons or the escape key.

The rates associated with each parameter can be changed using the mouse in very much the same way as the parameters themselves. The right hand mouse button causes a ten percent rate increase; the left a ten percent decrease. The center mouse button causes a data entry popup box to appear allowing a new rate value to be entered from the keyboard. Data entry can be aborted by depressing one of the mouse buttons or the escape key.

The cursor control panel is located on the left hand side of the screen below the database control panel. The cursor provides a means of measuring the absolute position of any point visible in any pane.

At any given time the cursor is either on or off. Selecting the cursor on/cursor off box in the cursor region with the mouse toggles the cursor between on and off.

When the cursor is on two sets of three-dimensional Cartesian coordinates designated front and back are displayed while the mouse is positioned in any of the displayed panes. A white dot follows the position of the mouse and a white line may be visible in other panes.

This white dot and line are different views of the three dimensional cursor. The cursor is a line perpendicular to the viewpoint of the pane in which the mouse is located. The 3D cursor runs through the tip of the arrow cursor controlled by the mouse. This line runs from the near clipping plane to the far clipping plane of the viewpoint of the window. The near and far coordinates displayed in the cursor region are the positions of the points defined by the intersection of this line with near (front coordinates) and far (back coordinates) clipping planes.

This cursor can be used to determine the position of a particular point in space by adjusting one of the clipping planes of a pane so that it intersects the point and then using the mouse to move the arrow cursor to coincide with that point in the same pane. The position of this point will then be displayed in three space as either the back or front coordinate depending on which clipping plane was used.

The options control panel contains a variety of boxes which control various Microscope features.

views;

Selection of this box with a mouse causes the main user interface display to be replaced by a data browser.

data;

Selection of this box with the mouse causes the main user interface display to be replaced by a data browser.

statistics;

Selection of this box with the mouse causes the main user interface display to be replaced by a statistics browser.

displacements;

Selection of this box with the mouse causes the main user interface display to be replaced by a displacements browser.

distortions;

Selection of this box with the mouse causes the main user interface display to be replaced by a distortions browser.

view drawing;

Selection of this box with the mouse initiates a full screen display of a CAD drawing. The mouse is used to control pan and zoom in this display mode. Movement of the mouse with the left button depressed pans the drawing. Movement of the mouse with the right button depressed zooms the drawing (the zoom factor increases as the mouse is moved away from the lower left corner of the screen). This display mode is terminated using the keyboard escape key.

toolpath off/on;

Selecting this box with the mouse reverses the visibility of the NC toolpath. The toolpath is displayed in all panes when visible. The toolpath traces the path of a cutting tool as described by an APT CL print file listing.

skin depths;

This box controls the skin depth histogram displays. Four skin depth displays are available; part, casting, inner, and outer. The skin depth display consists of a grid of lines perpendicular to the X-Y plane with a Z value equal to the skin depth at this point. The line is colored green at points with positive skin depth and red at points with negative skin depth.

Any of these skin depth displays can be activated by selecting the corresponding box with the mouse. Only one display can be on at one time. Selecting the box corresponding to a currently active skin depth display deactivates the display. Selecting any of the skin depth histograms deactivates any active skin display.

offset off/on;

This box controls whether the local (per patch) displacement correction is applied to the workpiece patch in all displays. In the off condition the workpiece data is shown before correction. In the on condition the workpiece data is shown after correction. The offset is normally off.

axes off/on;

Selecting this box with the mouse reverses the visibility of a set of three dimensional coordinate axes. The axes are displayed in all panes when visible. The segments of the axes are color coded as follows:

red: positive x
green: positive y
blue: positive z
magenta: negative x
yellow: negative y
cyan: negative z locks off/locks on;

This box controls viewpoint locking of the current pane. Selecting this box with the mouse turns lock off if locks were previously on or turns locks on if they were off.

Viewpoint locking determines whether the mouse can be used to vary the viewpoint of the current pane. With locks on the viewpoint of the current pane is controlled by the parameters of the operator interface viewpoint. With locks off the mouse x and y position controls two sequential viewpoint rotations which combine to allow the viewpoint to be moved continuously through a solid angle of at least 300 degrees.

fullscreen;

The fullscreen box controls the full screen user interface mode. Selecting this box with the mouse causes the current pane to be expanded to fit the entire display. This mode is terminated with the keyboard escape key.

In fullscreen mode the simultaneous depression of all three mouse buttons causes the screen to be redrawn with fill hidden line and surface removal using the technique of Z-buffering. This display will continue until one of the mouse buttons is depressed.

The viewpoint of the Z-buffered display with locks off will be the viewpoint at the moment that the display was initiated. The Z-buffer display view point is stationary, movement of the mouse has no effect with locks off in this mode.

help;

Selection of the help box with the mouse causes a popup help text browser to appear in the center of the display. The left mouse button pages forward through the help text; the right mouse pages backwards. The middle mouse button or the keyboard escape key terminates the browser.

quit;

Selection of the quit box with the mouse causes the Microscope program to terminate. A popup data entry box is provided for confirmation.

The distortion meter control panel occupies the bottom left-hand side of the control panel. The distortion meter gives the estimated distortion parameters for the current patch. These parameters include:

type: A qualitative classification based on distortion parameters. One of:
  None
  Offset
  slope
  elliptic parabola
  hyperbolic parabola
  saddle point
magnitude: A relative measure of the magnitude of distortion.
fit: A diagnostic for the parameter estimation process. Should be close to one.
x squared: The x squared coefficient of distortion.
x*y: The cross product coefficient of distortion.
y squared: The y squared coefficient of distortion.
x: The linear coefficient of distortion in x.
y: The linear coefficient of distortion in y.
constant: The constant coefficient of distortion.

Macroscope 48 provides facilities for analysis of component part surface mesh data collected by the component evaluation system study. The data for each component part surface is a set of views as discussed hereinbefore, Each position of the structured light probe 17 produces one view. Macroscope looks simultaneously at a plurality of views in relation to the design information including CAD or reference part models.

The Macroscope user interface includes two square windows, the left hand window 53 and the right hand window 54. The right hand window is a single pane window. The left hand window has four panes 53a-d. Each of these five panes has a separate point of view and depth of field. Each can be used to view the current workpiece as well as up to four CAD design models, and an NC tool path.

The left hand window 53 can display all of its panes simultaneously in separate quadrants or one pane at a time. A set of "radio button" boxes above the left window control which pane or panes are currently displayed.

These radio buttons are marked for each of the four quadrants of the window; NE, NW, SW, and SE. Not more than one of these buttons can be selected at one time. If one of the buttons is selected then the pane from the corresponding quadrant fills the entire window. If none of the buttons is selected then all four quadrants are displayed.

The buttons are controlled by selection with the mouse. Selecting a button which is off will turn that button on and all others off. Selecting a button that is on will turn that button off.

At any given time one of the visible window panes is the current pane. The current pane is identified by a red border; all other panes have a white border. The current pane can be changed by selecting any of the visible panes with the mouse. If any of the left hand window panes are selected then selecting any of the panes to fill the window will make that pane the current pane. When the left hand window changes from a single pane to a quad pane display the last window displayed as a single pane will be the current pane. That pane remains the current pane if the left window reverts to the four quadrant display.

The main Macroscope control panel consists of database, viewpoint, cursor, and option control panels. The database control panel contains:

workpiece;

Selecting this box with the mouse will cause a listing of the workpiece surface map data sets currently held in the database. Any of these datasets can be loaded by selecting the desired dataset name with the mouse. The selection process can be aborted either by selecting an empty position or by depressing the escape key. The name of the selected dataset is displayed in the area to the right of the box. An asterisk (*) in this position means that no dataset is currently loaded.

part, casting, inner, and outer;

Selecting any one of these boxes with the mouse will cause a listing of the CAD design models currently held in the database. Any of these models can be loaded by selecting the desired model name with the mouse. The selection process can be aborted either by selecting an empty position or by depressing the escape key. The name of the selected model is displayed in the area to the right of each of the boxes. An asterisk (*) in this position means that no model is currently loaded.

both off/mesh on/panels on/both on;

Each box has one of four values. The mesh on value displays the visible areas of the mesh as an open mesh. Panels on displays the the visible areas of the mesh as a filled mesh with backface hiding. Both on displays the visible areas of the mesh with both the open and filled meshes. In this last mode the area appears as a filled mesh from the outside and an open mesh from the inside of the mesh.

Selecting one of these boxes with the mouse alters the visibility of the workpiece or one of the design models. Selection of a box with the right mouse button causes the value of this box to cycle forward. Selection of a box with the left mouse button causes the value of this box to cycle backward.

Five of these boxes are provided, one for each type of the CAD design models as well as one for the workpiece mesh. These boxes control whether the visible areas (zones for models, patches for the workpiece) of each of the five mesh types will be displayed and how.

frame on/frame off boxes;

Selecting one of these boxes with the mouse reverses the visibility of one of the design model wire frames. Four of these boxes are provided, one for each type of design model. This type of box controls whether the IGES wireframe model from which the CAD model surface mesh was derived will be displayed along with the mesh. this wireframe is used to outline the major features of the design model. The wire frame display is particularly useful when only a few CAD model zones are selected for display.

current view;

Selection of this box with the mouse causes the view selector panel to replace the main control panel. Each box on the selector panel is used to select a specific view as the current view. A box with a colored border indicates a view which is defined but not visible. A box with a full colored background indicates a view which is defined and visible. Any defined view selected with the mouse becomes the current view. The number of the current view is displayed in the area to the right of the current view box.

album;

Selecting this box with the mouse will cause a listing of the albums currently held in the database. Any of these albums can be loaded by selecting the desired album name with the mouse. The selection process can be aborted either by selecting an empty position or by depressing the escape key. The name of the selected album is displayed in the area to the right of the box. An asterisk (*) in this position means that no album is currently loaded.

toolpath;

Selecting this box with the mouse will cause a listing of the NC toolpaths currently held in the database. Any of these toolpaths can be loaded by selecting the desired toolpath name with the mouse. The selection process can be aborted either by selecting an empty position or by depressing the escape key. The name of the selected toolpath is displayed in the area to the right of the box. An asterisk (*) in this position means that no toolpath is currently loaded.

drawing;

Selecting this box with the mouse will cause a listing of CAD drawings currently held in the database. Any of these drawings can be loaded by selecting the desired drawing name with the mouse. The selection process can be aborted either by selecting an empty position or by depressing the escape key. The name of the selected drawing is displayed in the area to the right of the box. An asterisk (*) in this position means that no drawing is currently loaded.

alarm limits;

Selecting this box with the mouse will cause a listing of the sets of workpiece patch summary statistics alarm limits currently held in the database. Any of these limit sets can be loaded by selecting the desired limit set name with the mouse. The selection process can be aborted either by selecting an empty position or by depressing the escape key. The name of the selected limit set is displayed in the area to the right of the box. An asterisk (*) in this position means that no limit set is currently loaded.

current patch;

Selecting the current patch box with the mouse causes a popup patch selector control panel to be displayed in place of the main control panel. Those patches with colored borders are defined but not visible. Those patches with colored backgrounds are defined and visible. All other patches are undefined. Any patch can be selected. An undefined patch can be edited but not be defined until it is saved.

The viewpoint control panel appears in the upper right hand corner of the screen above the right hand window. Ten viewpoint parameters are provided for controlling the location and orientation of the current pane.

The location and orientation in space of a viewpoint is specified primarily by two points: from and to. Both of these points have X, Y, and Z Cartesian coordinates in three space. The "from" point is the position of the origin of the viewpoint. The "to" point is a point in the exact center of the field of view of the viewpoint.

The twist parameter controls the rotation of the field of view around the line connecting the from and to points. The zoom parameter is a scaling factor for the field of view parameters. Near and far control the depth of field of the current pane.

Viewpoint parameters are modified by use of the mouse. The right hand mouse button increases the value of each parameters by the rate value shown immediately to the left of each parameter. If the right button is held down the parameter value is incremented continuously at about 2 increments per second after a short delay. The left hand mouse button works in the same way but decrements the parameter.

The center mouse button causes a data entry popup box to appear allowing a new parameter value to be entered from the keyboard. Data entry can be aborted by depressing one of the mouse buttons or the escape key.

The rates associated with each parameter can be changed using the mouse in very much the same way as the parameters themselves. The right hand mouse button causes a ten percent rate increase; the left a ten percent decrease. The center mouse button causes a data entry popup box to appear allowing a new rate value to be entered from the keyboard. Data entry can be aborted by depressing one of the mouse buttons or the escape key.

The cursor control panel is located on the left hand side of the screen below the database control panel. The cursor provides a means of measuring the absolute position of any point visible in any pane.

At any given time the cursor is either on or off. Selecting the cursor on/cursor off box in the cursor region with the mouse toggles the cursor between on and off.

When the cursor is on two sets of three-dimensional Cartesian coordinates designated front and back are displayed while the mouse is positioned in any of the displayed panes. A white dot follows the position of the mouse and a white line may be visible in other panes.

This white dot and line are different views of the three dimensional cursor. The cursor is a line perpendicular to the viewpoint of the pane n which the mouse is located. The 3D cursor runs through the tip of the arrow cursor controlled by the mouse. This line runs from the near clipping plane to the far clipping plane of the viewpoint of the window. The near and far coordinates displayed in the cursor region are the positions of the points defined by the intersection of this line with near (front coordinates) and far (back coordinates) clipping planes.

This cursor can be used to determine the position of a particular point in space by adjusting one of the clipping planes of a pane so that it intersects the point and then using the mouse to move the arrow cursor to coincide with that point in the same pane. The position of this point will then be displayed in three space as either the back or front coordinated depending on which clipping plane was used.

The options control panel contains a variety of boxes which control various viewfinder features.

view control;

Selection of this box causes the view selector control panel to replace the main control panel. The view control panel is used to control the visibility of the views in the current album. An box with a colored border indicates a view which is defined but not visible. A box with a full colored background indicates a view which is defined and visible. Selection of an box with the mouse toggles the visibility of the corresponding view.

zone control;

Selection of this box causes the zone control panel to replace the main control panel. The zone control panel is divided horizontally into four sections. These sections control, left to right, the zones of the part, casting, inner, and outer design zone meshes.

Each control consists of an eight by eight array of numbered boxes. Each box is numbered and controls the visibility of one of the zones of a CAD model. A box with a colored border indicates a zone which is defined but not visible. A box with a full colored background indicates a zone which is defined and visible. Selection of a box with the mouse toggles the visibility of the corresponding zone.

The zone control panel display is terminated by depressing the keyboard escape key.

plot drawing;

Selection of this box with the mouse initiates a full screen display of a CAD drawing. The mouse is used to control pan and zoom in this display mode. Movement of the mouse with the left button depressed pans the drawing. Movement of the mouse with the right button depressed zooms the drawing (the zoom factor increases as the mouse is moved away from the lower left corner of the screen). This display mode is terminated using the keyboard escape key.

statistics;

Selection of this box with the mouse causes the main user interface display to be replaced by the statistics browser.

data points;

Selection of this box with the mouse causes the main user interface display to be replaced by the data browser.

displacements;

Selection of this box with the mouse causes the main user interface display to be replaced by the displacements browser.

distortions;

Selection of this box with the mouse causes the main user interface display to be replaced by the distortions browser.

toolpath off/on;

Selecting this box with the mouse reverses the visibility of the NC toolpath. The toolpath is displayed in all panes when visible. The toolpath traces the path of a cutting tool as described by an APT CL print file listing.

camera off/on;

Selecting this box with the mouse reverses the visibility of the camera. The camera is displayed in all panes when visible. The camera is a three dimensional object which shows the location and orientation of the current view. The camera consists of a three dimensional red and green bounding region outlining the boundaries of the view, a white line connecting the to point with the from point, and a red and green pyramid connecting the from point with the intersection of the near cutting plane with the bounding region.

views off/on;

Selecting this box with the mouse reverses the visibility of the view markers. The view markers are displayed in all panes when visible. A viewpoint marker is identical in shape to the camera. While there is only one camera there is one viewpoint marker for each defined view in the current album. The color of each viewpoint marker is keyed to the number of the view it represents. These colors are the same as those shown as visible on the album control popup are visible when the views are turned on.

axes off/on;

Selecting this box with the mouse reverses the visibility of a set of three dimensional coordinate axes. The axes are displayed in all panes when visible. The segments of the axes are color coded as follows:

red: positive x
green: positive y
blue: positive z
magenta: negative x
yellow: negative y
cyan: negative z path off/on;

Selecting this box with the mouse reverses the visibility of the path. The path is displayed in all panes when visible. The path is a green dotted line which connects the from point of the views in order. The path includes all defined views including those not currently visible.

grid off/on;

Selecting this box with the mouse reverses the visibility of the grid. When enabled the grid is displayed in all panes.

The camera grid shows the location of the points to be sampled when the workpiece surface mesh is created. The grid display is independent of the camera display.

Offset off/on;

This box controls whether the global displacement offset provided by Autopilot is applied to the workplace in all views. In the off condition the workpiece data is shown before correction. In the on condition the workpiece data is shown after correction. The offset should normally be on.

views off/on;

Selecting this box with the mouse reverses the visibility of the view markers. The view markers are displayed in all panes when visible. A viewpoint marker is identical in shape to the camera. While there is only one camera there is one viewpoint marker for each defined view in the current album. The color of each viewpoint marker is keyed to the number of the view it represents. These colors are the same as those shown on the album control popup. Only those views which are shown as visible on the album control popup are visible when the views are turned on.

locks off/on;

This box controls viewpoint locking of the current window. Selecting this box with the mouse turns lock off if locks were previously on or turns locks on if they were off.

Viewpoint locking determines whether the mouse can be used to vary the viewpoint of the current pane. With locks on the viewpoint of the current pane is controlled by the parameters of the operator interface viewpoint. With locks off the mouse x and y position controls two sequential viewpoint rotations which combine to allow the viewpoint to be moved continuously through a solid angle of at least 360 degrees.

fullscreen;

The fullscreen box controls the full screen user interface mode. Selecting this box with the mouse causes the current pane to be expanded to fit the entire display. This mode is terminated with the keyboard escape key.

In fullscreen mode the simultaneous depression of all three mouse buttons causes the screen to be redrawn with fill hidden line and surface removal using the technique of Z-buffering. This display will continue until one of the mouse buttons is depressed.

The viewpoint of the Z-buffered display with locks off will be the viewpoint at the moment that the display was initiated. The Z-buffer display viewpoint is stationary, movement of the mouse has no effect with locks off in this mode.

help;

Selection of the help box with the mouse causes a popup help text browser to appear in the center of the display. The left mouse button pages forward through the help text; the right mouse pages backwards. The middle mouse button or the keyboard escape key terminates the browser.

quit;

Selection of the quit box with the mouse causes the Macroscope program to terminate. A popup data entry box is provided for confirmation.

The displacement meter occupies the bottom left-hand side of the control panel. The displacement meter gives the estimated global (Autopilot) displacement parameters for the current patch. These parameters include:

magnitude: A relative measure of the magnitude of displacement.

fit: A diagnostic for the parameter estimation process. Should be close to one.

x offset: The X axis linear displacement estimate for the patch in inches.

y offset: The Y axis linear displacement estimate for the patch in inches.

z offset: The Z axis linear displacement estimate for the patch in inches.

roll: The X axis angular displacement estimate for the patch in degrees.

pitch: The Y axis angular displacement estimate for the patch in degrees.

yaw: The Z axis angular displacement estimate for the patch in degrees.

Although the best mode contemplated for carrying out the present invention has been herein shown and described, it will be apparent that modification and variation may be made without departing from what is regarded to be the subject matter of the invention.

What we claimed is:

1. A generic component evaluation system which assumes all evaluated component surfaces have arbitrary distortions, comprised of
   a three dimensional graphics workstation comprising a display, a processor and manual data entry means, said processor connected to receive component surface design data,
   a metrology cell coupled to said workstation, comprising
   multiaxis movable positioner means for holding and positioning the component,
   a structured light probe mounted on said positioner means for directing a structured light pattern to impinge on the component surface,
   means for reconstructing discontinuities in said structured light pattern within a view of impingement on the component surface,
   image acquisition means mounted on said positioner means for viewing impingement of said structured light pattern on the component surface and for obtaining three dimensional surface position data relating thereto wherein all three dimensions are variable substantially throughout one view of impingement of said structured light pattern,
   Fourier transform profilometry means for receiving said three dimensional surface position data and for identifying points on the component surface within said one view in three dimensions, and
   means for determining the relative positions in space of the component surface and a surface represented by the component surface design data.

2. A generic component evaluation system as in claim 1 wherein said workstation comprises a high graphics bandwidth three dimensional graphics engine, a color display, and a displayed processor function selector.

3. A generic component evaluation system as in claim 1 wherein said multiaxis movable positioner means comprises a component fixture means for holding said component in predetermined position and orientation, mounting means for mounting said component fixture thereon, means for moving said mounting means in at least three dimensions, means for monitoring the position of said mounting means, and means for correcting said three dimensional surface position data for structured light probe and image acquisition means relative orientation and mounting errors.

4. A generic component evaluation system as in claim 1 wherein said structured light probe comprises means for projecting a plurality of collimated parallel light stripes as said structured light pattern.

5. A generic component evaluation system as in claim 1 comprising calibration means mounted in known position relative to said image acquisition means and directed toward the component for resolving ambiguity in said structured light pattern.

6. A generic component evaluation system as in claim 1 comprising data analysis means connected to said workstation for structuring said surface position data from a plurality of components to provide component product and process improvement indications.

7. A generic component evaluation system as in claim 1 wherein said workstation processor comprises means for reducing said surface position data and for driving said display to present said reduced surface position data pictorially, whereby system operator intuitive judgments may be made relative to component design and processing.

8. The generic component evaluation system of claim 1 comprising means for correcting the orientation of and position of said three dimensional surface position data to best fit the component surface design data whereby correction is obtained for component fixture mounting error.

9. A mechanical component three dimensional surface mapping system receiving three dimensional design data for the mechanical component, comprised of
   multiaxis positioner means movable in at least three dimensions,
   a mechanical component holding means mounted on said multiaxis positioner means, a structured light probe mounted on said multiaxis positioner means directing a structured light pattern toward said holding means, means for reconstructing discontinuities in said structured light pattern caused by mechanical component surface discontinuities, image acquisition means mounted on said multiaxis positioner means for viewing a field of impingement of said light pattern on the surface of the mechanical component and for providing variable three dimensional data relating to the component surface map therefrom, and computer means coupled to said multiaxis positioner means and said image acquisition means for employing Fourier transform profilometry to identify surface points within said field of impingement in three dimensions and for comparing said surface points with the three dimensional design data to determine the position in space of the component surface relative thereto.

10. A mechanical surface mapping system as in claim 9 wherein said computer means comprises a first computer means means for driving said multiaxis positioner means connected to said first computer means, means for monitoring the position of said multiaxis positioner means connected to said first computer means a second computer means receiving said surface point identifications for determining the distance between the mechanical component surface and the corresponding surface represented by the design data.

11. A mechanical component three dimensional system as in claim 10 comprising data analysis means connected to said second computer means for structuring said three dimensional surface map data for mechanical component product and process improvement indications.

12. A mechanical component three dimensional surface mapping system as in claim 9 wherein said mechanical component holding means comprises mechanical component fixture means for holding said mechanical component in predetermined position and orientation, together with means for correcting the orientation and position of said surface map data to best fit the three dimensional design data, whereby correction is obtained for component fixture mounting error.

13. A mechanical component three dimensional surface mapping system as in claim 9 wherein said structured light probe comprises means for projecting a plurality of parallel light stripes as said structured light pattern.

14. A mechanical component three dimensional surface mapping system as in claim 13 comprising a single light stripe projector mounted in known position and orientation relative to said structured light probe and directed toward said mechanical component, thereby resolving light stripe spacing ambiguity.

15. A mechanical component three dimensional surface mapping system as in claim 9 comprising means for calibrating said image acquisition means to remove ambiguity in the view of said structured light pattern.

16. A mechanical component three dimensional surface mapping system as in claim 9 wherein said computer means includes means for processing and displaying said three dimensional surface map data pictorially, whereby system operator intuitive judgments may be made relating to mechanical component processing and design.

17. A generic component evaluation system for a component surface subject to fabrication process induced surface distortions, wherein the system is connected to receive CAD data descriptive of the evaluated component surface and separable into CAD model mesh elements, comprising planning means connected to said surface mapping means including view selection means for selecting a number of views of the component to be observed, package plan means for selecting predetermined portions of and predetermined CAD models for each view, and packager means for converting between component frame of reference and surface mapping means frame of reference and for storing and ordering location data for CAD model mesh elements in each of said views, surface mapping means for obtaining at least one view of the component surface and for providing component three dimensional surface measurement data variable in all three dimensions from said at least one view, evaluation data reduction means for receiving and reducing said component three dimensional surface measurement data from a plurality of evaluated components, and three dimensional surface measurement data analysis means for receiving said reduced data and for providing analytical data indicative of product and process improvement to reduce the surface distortions.

18. A generic component evaluation system as in claim 17 comprising pathfinding means for efficiently ordering the sequence of said views.

19. A generic component evaluation system as in claim 17 wherein said surface mapping means comprises multiaxis movable positioner means for holding and positioning the component, a structured light probe mounted on said positioner means for directing a structured light pattern toward the component, means for reconstructing discontinuities in said structured light pattern, image acquisition means mounted on said positioner means for viewing impingement of said structured light pattern on the component and for sensing variable three dimensional surface map data within said at least one view, and Fourier transform profilometry processing means for receiving said variable three dimensional surface map data and for providing said three dimensional surface measurement data.

20. A generic component evaluation system as in claim 19 wherein said processing means comprises means for correcting said three dimensional surface measurement data for errors induced by relative structured light probe and image acquisition means position and orientation.

21. A generic component evaluation system as in claim 19 comprising communication means for receiving said three dimensional surface measurement data and ideal surface data from said design data and providing corrected surface measurement data to best fit the ideal surface data.

22. A generic component evaluation system as in claim 17 wherein said evaluation data reduction means comprises
    qualitative analysis means, and
    quantitative analysis means.
23. A generic component evaluation system as in claim 17 wherein said surface data analysis means comprises
    means for recalling measurement data for any combination of selected views,
    means for recalling measurement data for any individual view, and
    means for pictorially displaying said combination of or individual views so that reduced surface measurement data is visually presented.
24. A generic method of three dimensional mapping of a surface on a mechanical part wherein the surface is subject to arbitrary location within design data described limits, comprising the steps of
    planning a series of views of portions of the part surface using the design data,
    processing the design data to identify sets of selected design model surface mesh elements corresponding to each view and to identify each element's limits in two dimensions,
    orienting the mechanical part in an approximately known position,
    projecting a structured light pattern toward the part surface in each view to obtain variable three dimensional part surface measurement data for a plurality of surface points in each view,
    acquiring an image of the light pattern impinging on the part surface in each view,
    reconstructing discontinuities in the acquired image of the structured light pattern within each view,
    processing the acquired images using Fourier transform profilometry techniques to obtain variable three dimensional part surface measurements for each view,
    correcting the three dimensional part surface measurements to best fit the selected design model surface mesh elements,
    processing the corrected three dimensional part surface measurement data comparatively with the design model surface mesh elements to identify correspondence between the plurality of surface points and design model mesh elements, and
    calculating the distance between each measured surface point and the corresponding design model mesh element, whereby part skin depth is determined relative to the selected design model.
25. A generic method as in claim 24 wherein the design data is CAD data, comprising the step of
    selecting a predetermined CAD model and portions thereof to be utilized in said planning step.
26. A generic method of mapping a part surface as in claim 24 wherein the step of orienting the mechanical part comprises the step of adjusting the part position about a plurality of adjustment axes and correcting the three dimensional part surface measurement data for orientation and position errors imposed in the steps of projecting and acquiring.
27. A generic method as in claim 24 comprising
    arranging the series of views in a sequence to provide efficiency of movement during the probing step.
28. A generic method of mapping a part surface as in claim 24 wherein structure is provided for performing the steps of orienting and probing, comprising the steps of
    displaying the design model and the orienting and projecting structure models simultaneously,
    simulating a sequence of the views,
    checking for collisions between any of the models, and
    storing the simulated sequence that displays no collisions for use in the step of acquiring images in the planned series of views.
29. A generic method as in claim 24 comprising the step of correcting the surface measurement data for optical error.
30. A generic method as in claim 24 wherein the step of projecting a structured light pattern comprises the step of projecting a plurality of parallel light stripes, together with the step of resolving the ambiguity created by the pattern with a single rangefinding line.
31. A generic method of mapping a part surface as in claim 24 wherein the steps of orienting and projecting are performed in different coordinate systems and wherein the step of processing the acquired images comprises the step of transforming the design model mesh elements and the part surface measurement data into the structured light pattern coordinate system.
32. A generic method as in claim 24 comprising the step of
    computing summary statistics of the calculated distances to compare with skin depth trend limits.
33. A generic method as in claim 24 comprising the step of
    computing the distortion of the part within a view from the calculated distances.
34. A generic method as in claim 24 comprising the step of
    computing the displacement of the part within a view from the calculated distances.
35. A generic method as in claim 24 comprising the steps of
    computing skin depth trend limits, part distortion and part surface displacement from the calculated distances, and
    evaluating the part fabrication process with reference to the computations whereby process change is implemented to optimize the mechanical part surface within prescribed design data limits.
36. A generic method as in claim 24 comprising the step of
    analyzing the calculated distance data obtained from a plurality of views, and
    displaying the analyzed data as a geometric model, whereby intuitive design alterations ar readily observable.
37. A generic method as in claim 24 comprising the step of
    analyzing the calculated distance data obtained from a single view, and
    displaying the analyzed data as a geometric model, whereby intuitive design alterations are readily observable.
38. A generic method as in claim 24 wherein the step of processing the acquired images comprises
    obtaining raw three dimensional measurement data, further comprising the step of
    adjusting the raw three dimensional data with calibration data for optoelectrical structure view angle and lens distortion, and corresponding the raw three dimensional measurement data with ones of the design model surface mesh elements.

* * * * *